US008723526B2

(12) United States Patent
Shen et al.

(10) Patent No.: US 8,723,526 B2
(45) Date of Patent: May 13, 2014

(54) DEVICE AND METHOD OF TESTING AN INTERNAL RESISTANCE OF A BATTERY PACK

(75) Inventors: Xiaofeng Shen, Shenzhen (CN); Junna Peng, Shenzhen (CN)

(73) Assignee: BYD Co. Ltd., Shenzhen (CN)

( * ) Notice: Subject to any disclaimer, the term of this patent is extended or adjusted under 35 U.S.C. 154(b) by 432 days.

(21) Appl. No.: 12/907,156

(22) Filed: Oct. 19, 2010

(65) Prior Publication Data
US 2011/0101986 A1 May 5, 2011

(30) Foreign Application Priority Data

Oct. 29, 2009 (CN) .......................... 2009 1 0109967

(51) Int. Cl.
*G01N 27/416* (2006.01)
*H02J 7/00* (2006.01)
*G01R 31/36* (2006.01)
*H01M 10/48* (2006.01)
*G01R 19/165* (2006.01)
*H01M 2/10* (2006.01)

(52) U.S. Cl.
CPC .......... *G01R 31/3662* (2013.01); *H02J 7/0045* (2013.01); *H01M 10/48* (2013.01); *G01R 19/16542* (2013.01); *H02J 7/0031* (2013.01); *H01M 2/1055* (2013.01)
USPC .......................................... 324/430; 320/112

(58) Field of Classification Search
None
See application file for complete search history.

(56) References Cited

U.S. PATENT DOCUMENTS

| | | | | |
|---|---|---|---|---|
| 5,596,567 A | * | 1/1997 | deMuro et al. ................ | 320/106 |
| 5,963,012 A | * | 10/1999 | Garcia et al. .................. | 320/106 |
| 7,525,287 B2 | * | 4/2009 | Miyashita et al. ............ | 320/134 |
| 2004/0019441 A1 | * | 1/2004 | Larson .......................... | 320/104 |
| 2012/0136594 A1 | * | 5/2012 | Tang et al. .................... | 324/427 |

* cited by examiner

*Primary Examiner* — Jermele M Hollington
(74) *Attorney, Agent, or Firm* — Brinks Gilson & Lione

(57) ABSTRACT

An internal resistance testing device includes an excitation source and a battery pack, an adjustable resistance R, a sampling unit, and a control unit. The excitation source and the battery pack form a loop circuit. The adjustable resistance R may be located at the loop circuit formed by the excitation source and the battery pack. The sampling unit samples the voltage between two sides of the battery pack, the voltage between two sides of the adjustable resistance R, and the value of the adjustable resistance R. The control unit calculates internal resistance of the battery pack according to the signal value collected by the sampling unit. The internal resistances of different voltage-ranges the battery pack are determined by adjusting the value of the adjustable resistance R to cause the actual excitation voltage to be equal to the range voltage of the sampling unit. The voltage between two sides of the adjustable resistance R is made equal to the range voltage of the sampling unit by adjusting the value of the adjustable resistance R, which effectively improves measurement accuracy of the internal resistance.

16 Claims, 5 Drawing Sheets

DEVICE AND METHOD OF TESTING AN INTERNAL RESISTANCE OF A BATTERY PACK

CROSS-REFERENCE TO RELATED APPLICATIONS

The present application claims priority to, and the benefit of Chinese Patent Application No. 2009-10109967.2 filed Oct. 29, 2009, the entirety of which is incorporated herein by reference.

BACKGROUND

1. Field

This document relates to a device and method of testing an internal resistance of a battery pack, and more particularly, to a device and method of testing the internal resistance of a battery pack used in an electric vehicle and a hybrid powered vehicle.

2. Description of Related Art

The battery pack plays an important role in electric vehicle and hybrid power vehicle. The battery pack system is generally coupled in series. Individual cells in the battery pack may become damaged and affect the entire capacity of the battery pack. That means, the entire capacity of the battery pack can be determined by one or more damaged cells. Accordingly, accurately measuring each cell state is necessary to avoid the failure of the battery pack.

At present, the testing method for the internal resistance of the battery pack includes a direct current discharge method and an alternating current injection method. The direct current discharge method includes generating an instant load current generated by a battery pack, measuring the instant change of voltage at the electrode pole of the battery pack, and calculating the internal resistance of the battery pack. This has several disadvantages. First, the remaining capacity must be measured and displayed frequently, which requires the frequent measuring of the internal resistance, and care must be taken so as not to influence the normal operation and reduce the remaining capacity of the battery pack.

Second, the number of the battery packs in the electric vehicle is large, and such measurement may waste a large portion of the capacity of the battery pack, and may be only suitable when a large load resistance is applied and measured with a high current scope or other device. If the battery pack current is measured with a low current scope or other device, it may not be properly loaded with the required large current of about several tens of amperes in short amount of time of several seconds. Accordingly, a large current passes through the battery pack, which may damage the electrodes in the battery pack and may adversely affect measurement accuracy. Further, this method may not be used with hybrid vehicles.

The alternating current injection method includes adding a constant alternating audio current source to two sides of the battery pack, detecting the voltage difference between the two sides of the battery pack, and detecting the phase difference therebetween. The internal resistance of the battery pack may be determined according to Ohms' law.

In the alternating current injection method, safely detecting the internal resistance of the battery pack online may be realized with no need to discharge the battery pack, which avoids affecting performance of the battery pack. However, similar to the problems associated with the direct current discharge method, the alternating current injection method has a limitation problem of the voltage scope of the detected battery pack. Moreover, the alternating current injection method needs to used a processor or master control unit (MCU) to calculate certain trigonometric functions. Thus, the hardware circuit and algorithm is complicated, which affects measurement accuracy.

SUMMARY

The present invention is directed to solve at least one problem existing in the prior art. Accordingly, in order to solve the limitation problem of the voltage scope of the detected battery pack in the internal resistance test of the battery pack in prior art, the present invention provides a device and a method to test the internal resistance of the battery pack having different voltage scopes, which effectively improves the measurement accuracy of the internal resistance.

According to an aspect of the invention, an internal resistance testing device may be provided, comprising:

an excitation source and a battery pack, which may form a loop circuit;

an adjustable resistance R located at the circuit formed by the excitation source and the battery pack;

a sampling unit configured to collect the voltage between two sides of the battery pack, the voltage between two sides of the adjustable resistance R and the value of the adjustable resistance R;

a control unit, which may calculate the internal resistance of the battery pack according to the signal value collected by the sampling unit;

According to another aspect of the present invention, a testing method based on the aforementioned internal resistance testing device may be disclosed, comprising following steps:

a) injecting an excitation and the sampling unit collects the excitation voltage V2 between the two sides of the battery pack, the excitation voltage V1 between the two sides of the adjustable resistance R and the value of the adjustable resistance R;

b) adjusting the value of the adjustable resistance R to cause the actual excitation voltage to be equal to the range voltage of the sampling unit;

c) calculating the internal resistance of the battery pack according to signal value collected by the sampling unit.

In the aforementioned technologic scheme, by adjusting the value of the adjustable resistance R, the voltage between two sides of the adjustable resistance R collected by the sampling unit is equal to the range voltage of the sampling unit, which may test the internal resistance of the battery pack having different voltage scope. Moreover, by adjusting the adjustable resistance R, the adjustment of current and voltage in the circuit may be realized and the voltage between two sides of the adjustable resistance R collected by the sampling unit is equal to the range voltage of the sampling unit. The aforementioned technologic scheme may improve the measurement accuracy of the internal resistance of the battery pack effectively.

BRIEF DESCRIPTION OF THE DRAWINGS

These and other aspects and advantages of the invention will become apparent and more readily appreciated from the following descriptions taken in conjunction with the drawings in which.

DETAILED DESCRIPTION

Figure 1:
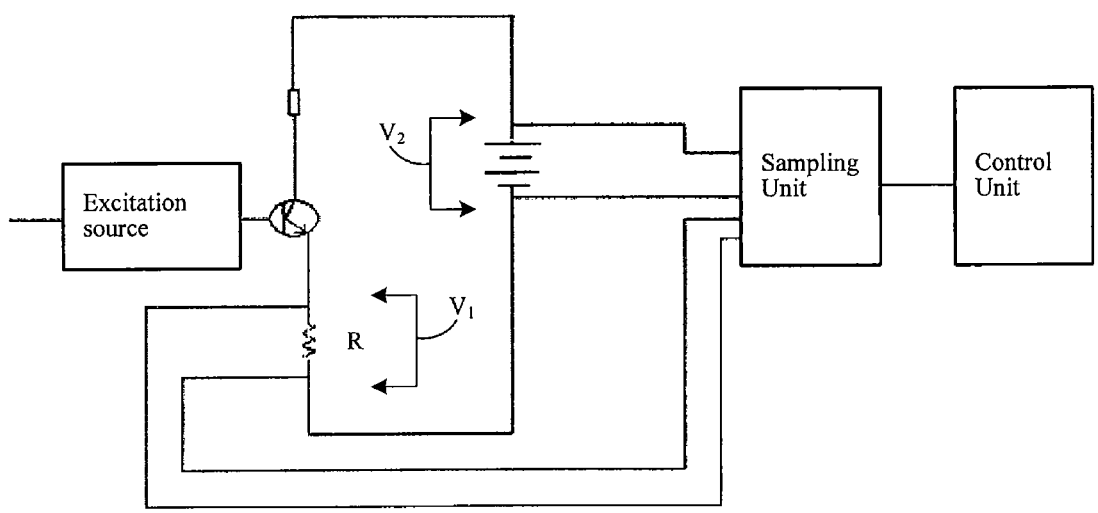
FIG. 1 shows a block diagram of the internal resistance test device of the battery pack according to an embodiment of the present invention.

Reference will be made in detail to embodiments of the present invention. The embodiments described herein with reference to drawings are explanatory, illustrative, and used to generally to understand the disclosure. The embodiments shall not be construed to limit the present invention. The same or similar elements and the elements having the same or similar functions are denoted by like reference numerals throughout the descriptions.

As shown in FIG. 1, an embodiment of the present invention discloses an internal resistance testing device of the battery pack, which includes an excitation source and a battery pack, an adjustable resistance R, a sampling unit and a control unit. The excitation source and the battery pack may form a loop circuit. The adjustable resistance R may be located at the circuit formed by the excitation source and the battery pack. The sampling unit may be configured to measure the voltage between two sides of the battery pack, the voltage between two sides of the adjustable resistance R, and the value of the adjustable resistance R. And the control unit may calculate the internal resistance of the battery pack according to the signal value collected by the sampling unit.

According to a preferred embodiment, the excitation source may include an alternating excitation source, which may form a loop circuit with the battery pack, a transistor or switch, and the adjustable resistance R. The excitation source may inject an alternating excitation signal via the control end of the transistor, so as to provide a sine wave excitation signal to the circuit, an excitation voltage between two sides of the adjustable resistance, and an excitation voltage V between two sides of the battery pack.

The sampling unit may determine the voltage between two sides of the battery pack, the voltage between two sides of the adjustable resistance R, and the value of the adjustable resistance R. After the circuit is injected with the alternating excitation signal, excitation voltages between two sides of the adjustable resistance R and between two sides of the battery pack may be produced, and the sampling unit may determine excitation voltages between two sides of the adjustable resistance and between two sides of the battery pack, as well as the value of the adjustable resistance. Preferably, the sampling unit may include a collection chip, such as a "dual standard buck with integrated switching MOSFET," commercially available from Intersil Corp., model CS5463, or a similar integrated device capable of measuring instantaneous current and voltage, and perform calculations thereon.

The control unit may be connected with the sampling unit, and may calculate the internal resistance of the battery pack according to the signal value collected by the sampling unit to determine the internal resistance of the battery pack. Preferably, the control program corresponding to the control unit may be integrated into a sampling unit. In that regard, the control unit, along with the control program, may be incorporated into the sampling unit, such as the dual standard buck with integrated switching MOSFET. Because the function of the control unit and/or the sampling unit may be combined, the terms "collected," "sampled," "determined," "measured," and the like may be used interchangeably throughout this document. The components may be separate and distinct components or alternatively, may be functionally and/or physically combined in a signal package or board. The battery pack preferably includes at least one cell.

According to another embodiment of the present invention, a testing method based on the aforementioned internal resistance testing device of the battery pack, includes:

a) injecting an alternating excitation and the sampling unit collects the voltage between two sides of the battery pack, the voltage between two sides of the adjustable resistance R and the value of the adjustable resistance R;

b) adjusting the value of the adjustable resistance R to cause the actual excitation voltage to be equal to the range voltage of the sampling unit;

c) calculating the internal resistance of the battery pack according to the signal value collected by the sampling unit.

Figure 2:
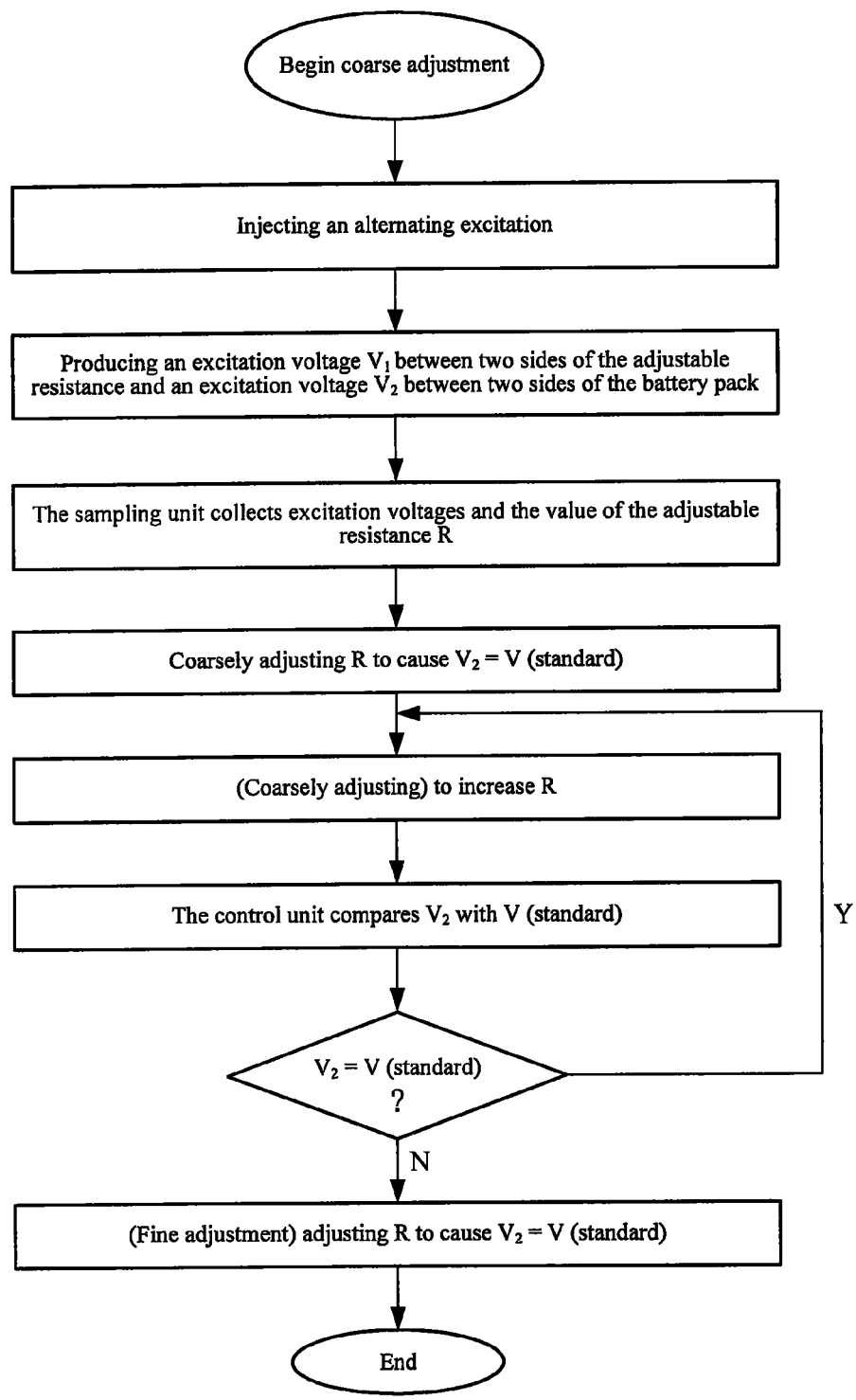
FIG. 2 shows a coarse adjustment flow chart of the adjustable resistance in the internal resistance test device of the battery pack in FIG. 1.
Figure 3:
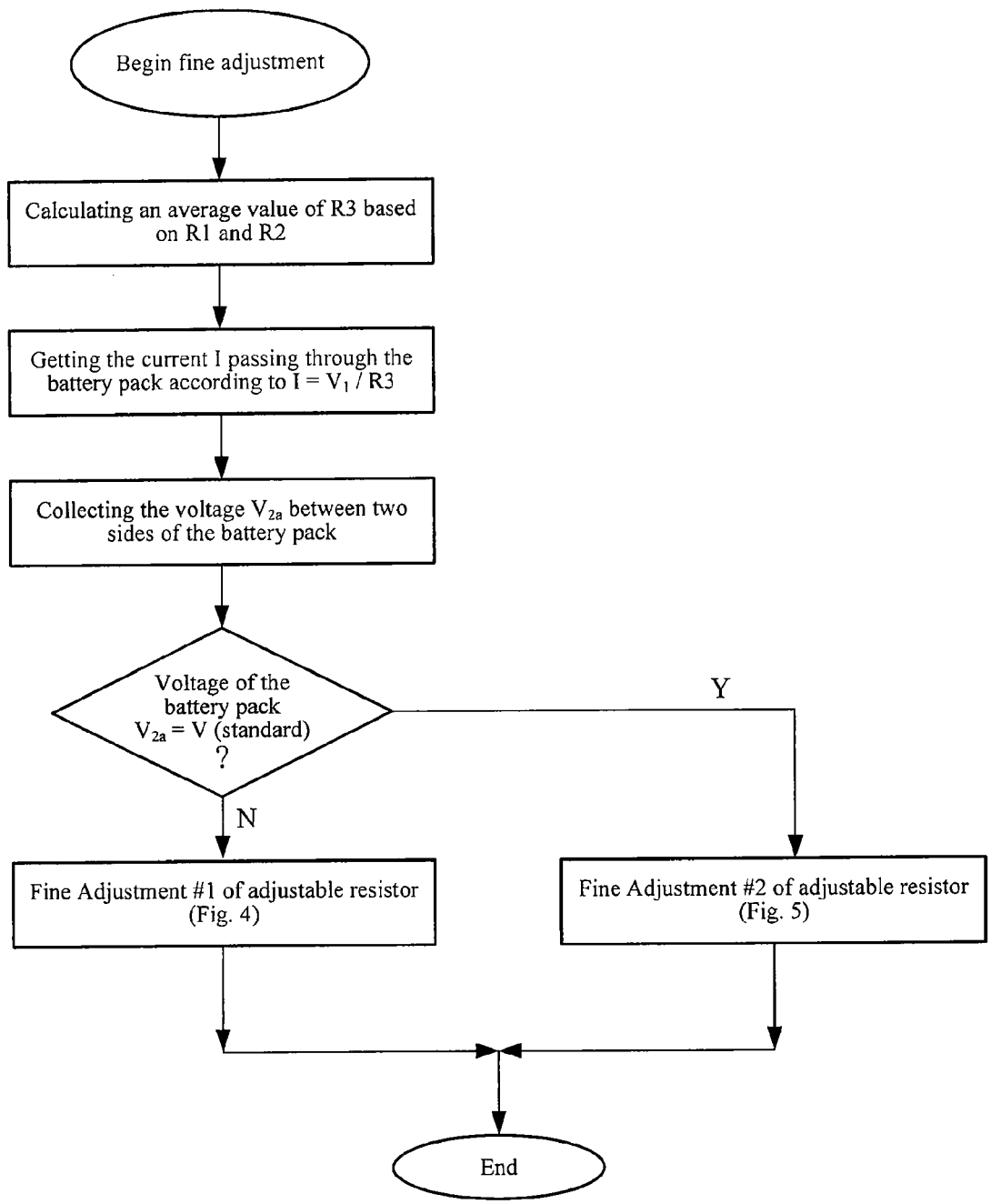
FIG. 3 shows a fine adjustment flowchart of the adjustable resistance in the internal resistance test device of the battery pack in FIG. 1.

The control process is described hereinafter:

As shown in FIG. 2 and FIG. 3, FIG. 2 shows a coarse adjustment process while FIG. 3 shows a fine adjustment process. As shown in FIG. 2, the excitation source may provide an alternating excitation signal to the circuit formed by the adjustable resistance and the battery pack via the control end of the transistor. Thus, a sinusoidal excitation current may be provided to the circuit. In response, an excitation signal V1 may be produced between two sides of the adjustable resistance R, and an excitation signal V2 may be produced between two sides of the battery pack.

The sampling unit may determine (collect or measure etc.) the following quantities: a) the excitation voltage V1 between two sides of the adjustable resistance R, b) the excitation voltage V2 between two sides of the battery pack, and c) the value of the adjustable resistance R. The sampling unit may send the collected signal to the control unit for further calculation and/or processing, where applicable;

The value of the adjustable resistance R is coarsely adjusted to cause the excitation voltage V2 to be about equal to a maximum range voltage V (standard) of the sampling unit, which determines if the excitation voltage signal collected by the sampling unit is clipped;

The adjustable resistance R is then coarsely adjusted to increase the value of the adjustable resistance R while the sampling unit collects the voltage V1 between the two sides of the adjustable resistance R, the voltage V2 between the two sides of the battery pack, and the value of the adjustable resistance R. The sampling unit transmits or sends the collected signal values to the control unit. The control unit (or the sampling unit if combined into one component) may compare the voltage V2 between two sides of the battery pack with the range voltage V (standard);

If V2=V (standard), interpreting a clipping produced in the waves; so that, keeping coarse adjustment of the adjustable resistance R to increase the value of the adjustable resistance R, the excitation current in the circuit may be reduced, the sampling unit may continuously collect the voltage between two sides of the adjustable resistance R, the voltage between two sides of the battery pack and the value of the adjustable resistance R, as well as sending the collected signal value to the control unit.

The control unit may compare the voltage V2 between two sides of the battery pack with the maximum range voltage V (standard) of the sampling unit. At that moment, if V2 is still equal to V (standard), clipping or distortion may still exist in the signal, so that, keeping increasing the value of the adjustable resistance R until V2 is less than V (standard);

If V2 is less than V (standard), beginning a fine adjustment of the adjustable resistance R to cause the voltage between two sides of the battery pack collected by the sampling unit is equal to the maximum range voltage V (standard) of the sampling unit. The concrete fine adjustment process as follow:

During the coarse adjustment of the adjustable resistance R, the control unit records the value of the adjustable resistance R1 which causes V2=V (standard) at last time and the following value of the adjustable resistance R2 which causes V<V (standard). If to cause the excitation voltage value between two sides of the battery pack is equal to the maximum range voltage of the sampling unit, the critical value of the adjustable resistance R is R0, so the data range of R0 is from R1 to R2, and the fine adjustment of the adjustable resistance R from R1 to R2;

As an optimum technology scheme, a is a minimum unit in fine adjustment of the adjustable resistance, m and n are integer variables set in system.

Figure 4:
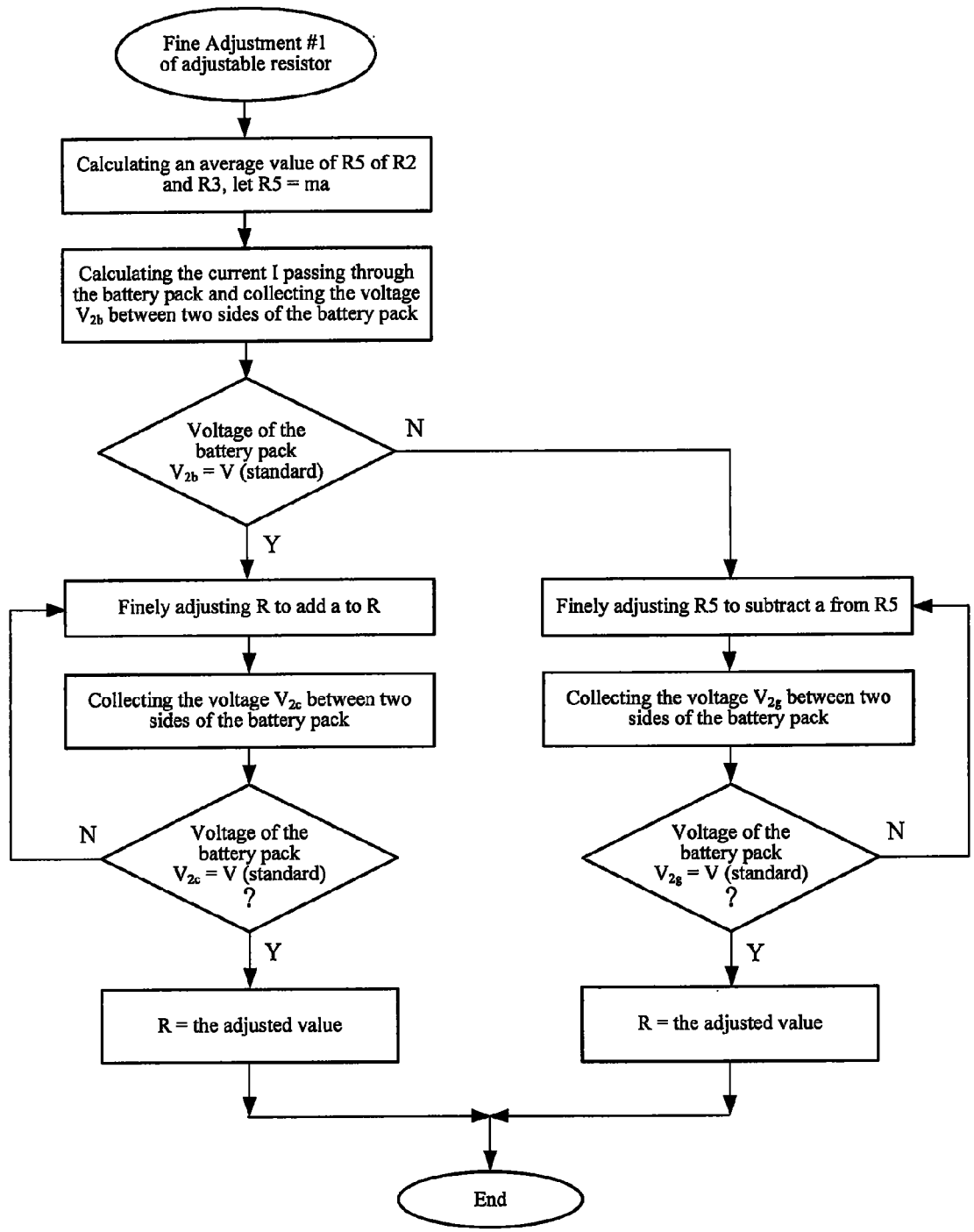
FIG. 4 is a flowchart showing testing of the internal resistance of the battery pack in FIG. 1.
Figure 5:
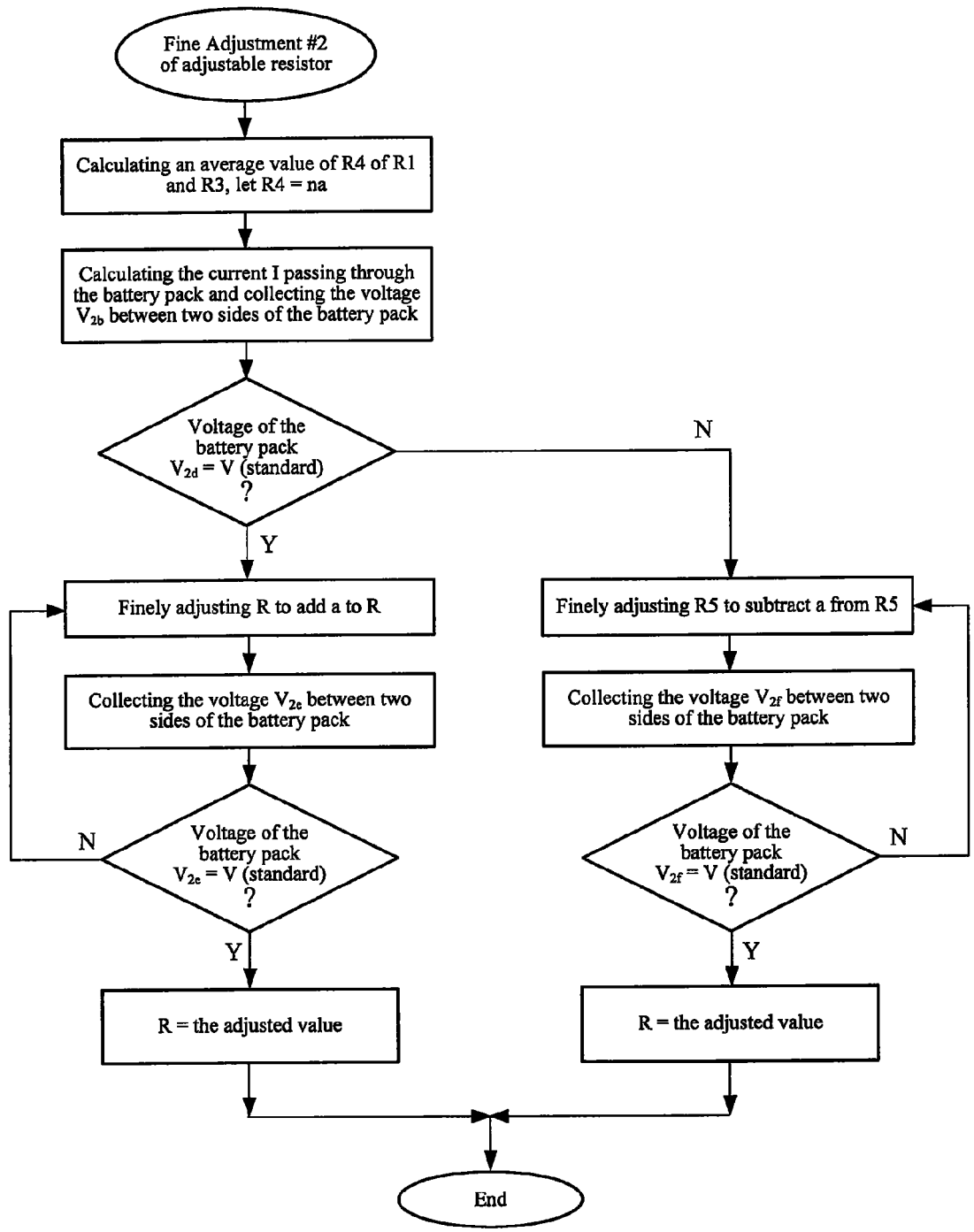
FIG. 5 is a flowchart showing testing of the internal resistance of the battery pack in FIG. 1.

FIG. 3 shows fine adjustment of the adjustable resistance R. During fine adjustment, adjusting the adjustable resistance R to cause the value of the adjustable resistance R is equal to an average value R3 of R1 and R2. The control unit may calculate the current in the circuit according to the formula I=V1/R3 and the voltage value V1 between two sides of the adjustable resistance R collected by the sampling unit. By collecting the voltage V2a between two sides of the battery pack, the sampling unit may send the voltage V2a between two sides of the battery pack to the control unit;

The control unit may compare the voltage V2a between two sides of the battery pack with V (standard). If the voltage V2a between two sides of the battery pack is equal to V (standard), the control unit may perform fine adjustment #1 of the adjustable resistor R, as shown in FIG. 4. If the voltage V2a between two sides of the battery pack is less than V (standard), the control unit may perform fine adjustment #2 of the adjustable resistor R, as shown in FIG. 5.

As shown in FIG. 4, if the voltage V2a between two sides of the battery pack is less than V (standard), R3<R0, the adjustable resistance R is needed to increase. Adjusting the adjustable resistance R to cause the value of the adjustable resistance R is equal to an average value R5 of R2 and R3, setting R5=ma. The control unit may calculate the current of the circuit according to the voltage V1 between two sides of the adjustable resistance, the value of the adjustable resistance R5 collected by the sampling unit, and using the formula I=V1/R5, and the voltage V2b between two sides of the battery pack which is collected by the sampling unit and sent to the control unit. If the voltage V2b between two sides of the battery pack collected by the sampling unit is still equal to V (standard), R5<R0, keeping increasing of the adjustable resistance R;

Fine adjustment of the adjustable resistance R to cause the value of the adjustable resistance R is (m+1) (a). The sampling unit may continuously collect the voltage V2c between two sides of the battery pack and send which to the control unit. If at the moment the voltage V2c between two sides of the battery pack collected by the control unit is less than V (standard), the control unit may set the value of the adjustable resistance R is (m+1)(a), that is, to cause the voltage between two sides of the battery pack is equal to V, the value of the adjustable resistance R is adjusted to be R=(m+1) (a), the internal resistance of the battery pack measured is most accurate at that moment.

If the voltage V2c between two sides of the battery pack received by the control unit is equal to V (standard), keep increasing the value of the adjustable resistance R, finely adjusting the adjustable resistance R to cause the value of the adjustable resistance R=(m+2) (a); then keep collecting the voltage between two sides of the battery pack. If the voltage between two sides of the battery pack is less than V (standard), the value of the adjustable resistance R is finally selected (m+2)(a), that is when the value of the adjustable resistance R is adjusted to be (m+2)(a), the internal resistance of the battery pack measured is most accurate; otherwise, keep increasing the value of the adjustable resistance via the minimum unit of the fine adjustment, with reference to the fine adjustment, until the value of the adjustable resistance R is (m+x−1) (a), thereof x is the fine times, the voltage between two sides of the battery pack is equal to V (standard). When the value of the adjustable resistance R is (m+x)(a), the voltage between two sides of the battery pack is less than V (standard); then only need to adjust the value of the adjustable resistance R to be (m+x)(a), the voltage between two sides of the battery pack is equal to V (standard), at that moment, the internal resistance of the battery pack measured is most accurate.

If the voltage V2b between two sides of the battery pack collected by the sampling unit is less than V (standard), R5>R0, need to reduce the value of the adjustable resistance R, fine adjusting the value of the adjustable resistance R=(m−1)(a), and the sampling unit may continuously collect the voltage V2g between two sides of the battery pack and send the voltage V2g to the control unit. If the voltage V2g of the battery pack collected by the control unit is equal to V (standard), the control unit may set the value of the adjustable resistance R is (m−1)(a), that is, if want the voltage between two sides of the battery pack is V (standard), need to adjust the value of the adjustable resistance R=(m−1)(a), at that time, the internal resistance of the battery pack is most accurate.

If the voltage V2g of the battery pack collected by the control unit is less than V (standard), keep reducing the value of the adjustable resistance R, finely adjusting the adjustable resistance R to cause the value of the adjustable resistance R=(m−2)(a), then keep collecting the voltage between two sides of the battery pack. If the voltage between two sides of the battery pack is equal to V (standard), the adjustable resistance R is finally adjusted to (m−2)(a), that is, when the adjustable resistance R is adjusted to (m−2)(a), the internal resistance of the battery pack measured is most accurate. Otherwise, keep reducing the value of the adjustable R, with reference to the method of fine adjustment, until the value of the adjustable resistance R is (m−z−1)(a), in which z is the fine times, the voltage between two sides of the battery pack is equal to V (standard). When the value of the adjustable resistance R is (m−z)(a), the voltage between two sides of the battery pack is less than V (standard), so only when the value of the adjustable resistance R is adjusted to be (m−z−1)(a), the voltage between two sides of the battery pack is equal to V (standard), at that moment, the internal resistance of the battery pack measured is most accurate.

As shown in FIG. 5, fine adjustment #2 of the adjustable resistor is shown because when the voltage V2a between two sides of the battery pack is less than V (standard), R3>R0 and the value of the adjustable resistance R is needed to reduce. Adjusting the adjustable resistance R to cause the value of the adjustable resistance R is equal to the average value R4 of R1 and R3, setting R4=n(a). The control unit may calculate the current in the circuit according to the voltage V1 between two sides of the adjustable resistance and the value of the adjustable resistance R4 collected by the sampling unit and the formula I=V1/R4. The sampling unit may collect the voltage V2d between two sides of the battery pack and send the voltage V2d to the control unit. If V2d is still less than V (standard), R3>R0, keep reducing the value of the adjustable resistance R;

By fine adjustment of the adjustable resistance, the value of the adjustable resistance is (n−1)(a). The sampling unit may continuously collect the voltage V2f between two sides of the battery pack and send the voltage V2f to the control unit. If at that moment the voltage V2f between two sides of the battery pack collected by the control unit is about equal to V (standard), the value of the adjustable resistance R is finally selected (n−1) a by the control unit, that is, to cause the voltage between two sides of the battery pack is equal to V (standard), the value of the adjustable resistance R is adjusted R=(n−1)(a), at that moment, the internal resistance of the battery pack measured is most accurate. If the voltage V2f between two sides of the battery pack received by the control unit is less than V (standard), keep reducing the value of the adjustable resistance R and by finely adjusting the adjustable resistance R, the value of the adjustable resistance R=(n−2)(a). Then keep collecting the voltage between two sides of the battery pack, if the voltage between two sides of the battery pack is about equal to V (standard), the value of the adjustable resistance R is finally adjusted to (n−2)(a), that is when the value of the adjustable resistance R is (n−2)(a), the internal resistance of the battery pack measured is most accurate. Otherwise, keep reducing the value of the adjustable resistance R with the minimum unit of the fine adjustment, with reference to the method of fine adjustment, until when the value of the adjustable resistance R is (n−y−1)(a), in which (y) is the times of fine adjustment, the voltage between two sides of the battery pack is equal to V (standard). When the value of the adjustable resistance R is (n−y)(a), the voltage between two sides of the battery pack is less than V (standard), so that, only when the value of the adjustable resistance R is adjusted to be (n−y−1)(a), the voltage between two sides of the battery pack is equal to V (standard), the internal resistance of the battery pack measured is most accurate.

If the voltage V2d between two sides of the battery pack collected by the sampling unit is about equal to V (standard), R3<R0 and it is needed to increase the value of the adjustable resistance R. Fine adjusting the adjustable resistance R to cause the value of the adjustable resistance R to be (n+1)(a), the sampling unit keeps collecting the voltage V2e between two sides of the battery pack and sending the voltage V2e to the control unit. If the voltage V2e between two sides of the battery pack received by the control unit is less than V (standard), the value of the adjustable resistance R is adjusted to be (n+1)(a) by the control unit, that is, to cause the voltage between two sides of the battery pack is V (standard), the value of the adjustable resistance R is adjusted to be (n+1)(a), and at that moment, the internal resistance of the battery pack measured is most accurate. If the voltage V2f between two sides of the battery pack received by the control unit is about equal to V (standard), keep increasing the value of the adjustable resistance R and by fine adjusting the adjustable resistance R, the value of the adjustable resistance R=(n+2)(a); then keep collecting the voltage between two sides of the battery pack, if the voltage V2f between two sides of the battery pack is less than V (standard), the value of the adjustable resistance R is finally adjusted to (n+2)(a), that is when the value of the adjustable resistance R is adjusted to be (n+2)(a), the internal resistance of the battery pack measured is most accurate. Otherwise, keep increasing the value of the adjustable resistance R with the minimum unit of the fine adjustment, with reference to the method of fine adjustment, until when the value of the adjustable resistance R=(n+w−1)(a), thereof w is the times of fine adjustment, the voltage between two sides of the battery pack is equal to V (standard) and when the value of the adjustable resistance R is (n+w)(a), the voltage between two sides of the battery pack is less than V (standard), so that, only when the value of the adjustable resistance R is adjusted to be (n+w)a, the voltage between two sides of the battery pack is equal to V (standard) and the internal resistance of the battery pack measured is most accurate.

By the coarse and fine adjustment of the adjustable resistance R, the control unit may calculate the current in the circuit according to the voltage V1 between two sides of the adjustable resistance R and the formula I=V1/R. Then the control unit may calculate the internal resistance making use of the voltage V2 between two sides of the battery pack that is collected by the sampling unit and the current I in the circuit. During injecting the alternating excitation, there is a phase-difference between the excitation voltage and the excitation current, that is the power coefficient PF, so that, the internal resistance of the battery pack is r=PF*V2/I, and the power coefficient PF may be calculated by the control unit In the aforementioned technology scheme, the value of the adjustable resistance may be adjusted via the manual adjustment or under program control.

Although explanatory embodiments have been shown and described, it would be appreciated by those skilled in the art that changes, alternatives, and modifications can be made in the embodiments without departing from spirit and principles of the invention. Such changes, alternatives, and modifications all fall into the scope of the claims and their equivalents.

What is claimed is:

1. An internal resistance testing device, comprising:
   an excitation source and a battery pack, which form a loop circuit;
   an adjustable resistance R located in the loop circuit;
   the excitation source located in the loop circuit and generating an excitation voltage;
   a sampling unit configured to measure:
      the voltage between two sides of the battery pack,
      the voltage between two sides of the adjustable resistance R, and
      a value of the adjustable resistance R; and
   a control unit that calculates an internal resistance of the battery pack according to the voltages measured by the sampling unit and the value of the adjustable resistance R; and
   wherein the control unit coarsely adjusts a value of the adjustable resistance R to cause the excitation voltage to be about equal to a maximum range voltage of the sampling unit, and wherein the control unit then finely adjusts the value of the adjustable resistance R to be equal to an average value of two voltages levels recorded when the adjustable resistance R was coarsely adjusted.

2. The device of claim 1, wherein the sampling unit includes a voltage and current measuring device.

3. The device of claim 1, wherein the excitation source is a sinusoidal excitation signal.

4. A method for determining an internal resistance of a battery pack, the battery pack contained in a loop circuit having an excitation source and an adjustable resistance R, the method comprising the steps of:
   injecting an excitation signal into the loop circuit;
   adjusting the value of the adjustable resistance R until the voltage V2 is equal to the range voltage V (standard);
   increasing the value of the adjustable resistance R until the voltage V2 is less than the range voltage V (standard);
   storing the value of the adjustable resistance in step (b) as R2;

storing the value of the adjustable resistance is R1 which causes the voltage V2 to be equal to the range voltage V (standard) at a previous measurement;

finely adjusting the value of the adjustable resistance R to cause an actual excitation, voltage between two sides of the battery pack to be equal to the range voltage V (standard); and calculating the internal resistance of the battery pack according to the voltage V1 between two sides of the adjustable resistance, the value of the adjustable resistance, and the voltage V2 between two sides of the battery pack after adjusting;

sampling an excitation voltage V2 generated between two sides of the battery pack;

sampling an excitation voltage V1 between the two sides of the adjustable resistance R;

determining a value of the adjustable resistance R;

adjusting the value of the adjustable resistance R to cause the excitation voltage V2 to be equal to a range voltage V (standard); and calculating the internal resistance of the battery pack based on the excitation voltage V2, the excitation voltage V1, and the adjusted value of the adjustable resistance R.

5. The method of claim 4, for a fine adjustment of the adjustable resistance, the method further comprises the steps of:

adjusting the adjustable resistance to cause the value of the adjustable resistance being equal to an average value R3 based on R1 and R2;

collecting a voltage V2a between two sides of the battery pack;

adjusting the value of the adjustable resistance according to the voltage V2a between two sides of the battery pack and the range voltage V (standard); and calculating an internal resistance of the battery pack according to the value R of the adjustable resistance, the voltage V1 between two sides of the adjustable resistance, and the voltage V2 between two sides of the battery pack.

6. The method of claim 5, wherein when the voltage V2a between two sides of the battery pack is equal to V (standard), the method further comprises the steps of:

adjusting the adjustable resistance R to cause the value of the adjustable resistance R to be equal to an average value R5 based on R2 and R3, wherein R5=m(a), wherein m is a predetermined integer value, wherein (a) is a minimum increment of fine adjustment of the adjustable resistance;

collecting the voltage V2b between two sides of the battery pack;

continuing to adjust the value of the adjustable resistance R according to the voltage V2b between two sides of the battery pack and the range voltage V (standard); and calculating the internal resistance of the battery pack according to the value R of adjustable resistance, the voltage V1 between two sides of the adjustable resistance R, and the voltage V2 between two sides of the battery pack.

7. The method of claim 6, wherein when the voltage V2b between two sides of the battery pack is equal to V (standard), the method further comprises the steps of:

adjusting the adjustable resistance R to cause the value of the adjustable resistance R=(m+1)(a);

collecting the voltage V2c between two sides of the battery pack; and when V2c<V (standard), the value of the adjustable resistance R is adjusted to be (m+1)(a), the internal resistance of the battery pack is calculated according to a signal value collected.

8. The method of claim 7, wherein when V2c=V (standard), the value of the adjustable resistance R is adjusted, and the method further comprises the steps of:

when the value R of the adjustable resistance R=(m+x−1) (a), wherein x is a count of the number of fine adjustment iterations, the voltage between two sides of the battery pack is equal to V (standard); and when the voltage between two sides of the battery pack is less than V and R=(m+x) (a), the value of the adjustable resistance is adjusted to be (m+x)(a); and calculating the internal resistance of the battery pack according to the signal value collected.

9. The method of claim 6, wherein when the voltage between two sides of the battery pack V2b<V (standard), the method further comprises the steps of:

adjusting the adjustable resistance to cause the value of the adjustable resistance R=(m−1) (a);

collecting the voltage between two sides of the battery pack V2g;

when V2g=V (standard), the value of the adjustable resistance R is adjusted to be (m−1) (a); and calculating the internal resistance of the battery pack according to the signal value collected.

10. The method of claim 9, wherein when V2g<V (standard), the value of the adjustable resistance R is adjusted, and the method further comprises the steps of:

when the value of the adjustable resistance R=(m−z−1) (a), wherein z is a count of a number of fine adjustment iterations, the voltage between two sides of the battery pack is equal to V (standard), and when R=(m−z)(a), the voltage between two sides of the battery pack is less than V (standard), so that when the value of the adjustable resistance R is adjusted to be equal to (m−z−1) (a), calculating the internal resistance of the battery pack according to the signal value collected.

11. The method of claim 5, wherein when the voltage between two sides of the battery pack V2b<V (standard), the method further comprises the steps of:

adjusting the adjustable resistance to cause the value of the adjustable resistance R to be equal to an average value R4 based on R1 and R3, wherein n is a predetermined integer variable, wherein (a) is a minimum increment of fine adjustment of the adjustable resistance R;

collecting the voltage V2d between two sides of the battery pack;

adjusting the value of the adjustable resistance R according to the voltage V2d between two sides of the battery pack and the range voltage V (standard);

calculating the internal resistance of the battery pack according to the value of the adjustable resistance R, the voltage V1 between two sides of the adjustable resistance R and the voltage V2 between two sides of the battery pack collected.

12. The testing method of claim 11, wherein when the voltage between two sides of the battery pack V2d=V (standard), the method further comprises the steps of:

adjusting the adjustable resistance to cause the value of the adjustable resistance R=(n+1) (a);

collecting the voltage between two sides of the battery pack V2e; and when V2*e*<V (standard) and the value of the adjustable resistance R is adjusted to be (n+1) (a), calculating the internal resistance of the battery pack according to the signal value collected.

13. The method of claim 12, wherein when V2*e*=V (standard) and the value of the adjustable resistance R is adjusted, the method further comprises the steps of:

when the value of the adjustable resistance R=(n+w−1) (a),
  wherein w is a count of the number of fine adjustment iterations,
  the voltage between two sides of the battery pack is equal to V (standard),
  R=(n+w) (a),
  the voltage between two sides of the battery pack is less than V (standard);
the value of the adjustable resistance R is adjusted to be equal to (n+w) (a); and
calculating the internal resistance of the battery pack according to a signal value collected.

14. The method of claim 11, wherein when the voltage between two sides of the battery pack collected by the sample unit V2*d*<V (standard), the method further comprises the steps of:

adjusting the adjustable resistance to cause the value of the adjustable resistance R=(n−1)(a);
collecting the voltage between two sides of the battery pack V2*f*; and
when V2*f*=V (standard) and the value of the adjustable resistance R is adjusted to be (n−1)(a), calculating the internal resistance of the battery pack according to the signal value collected.

15. The method of claim 14, wherein when V2*f*<V (standard), the value of the adjustable resistance R is adjusted, and the method further comprises the steps of:

when the value of the adjustable resistance R (n−y−1)(a),
  wherein y is a count of the number of fine adjustment iterations, the voltage between two sides of the battery pack is equal to V (standard),
  wherein R=(n−y)(a) and the voltage between two sides of the battery pack is less than V (standard),
the value of the adjustable resistance R is adjusted to be =(n−y−1)(a); and
calculating the internal resistance of the battery pack according to the signal value collected.

16. The method of claim 4, wherein the internal resistance of the battery pack R=PF*V2/I, wherein I=V1/R, and wherein I is the current in the loop circuit, PF is a power coefficient.

* * * * *